(12) United States Patent
Liu et al.

(10) Patent No.: US 12,035,605 B2
(45) Date of Patent: Jul. 9, 2024

(54) TEXTURE RECOGNITION APPARATUS AND MANUFACTURING METHOD THEREOF

(71) Applicant: BOE TECHNOLOGY GROUP CO., LTD., Beijing (CN)

(72) Inventors: Yingming Liu, Beijing (CN); Xiaoliang Ding, Beijing (CN); Lei Wang, Beijing (CN); Yunke Qin, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 32 days.

(21) Appl. No.: 17/630,544

(22) PCT Filed: Apr. 15, 2021

(86) PCT No.: PCT/CN2021/087583
§ 371 (c)(1),
(2) Date: Jan. 27, 2022

(87) PCT Pub. No.: WO2021/238492
PCT Pub. Date: Dec. 2, 2021

(65) Prior Publication Data
US 2022/0246695 A1    Aug. 4, 2022

(30) Foreign Application Priority Data

May 27, 2020 (CN) .......................... 202010461620.0

(51) Int. Cl.
*H10K 59/65*    (2023.01)
*G06V 10/141*   (2022.01)
(Continued)

(52) U.S. Cl.
CPC ........... *H10K 59/65* (2023.02); *G06V 10/141* (2022.01); *G06V 40/1318* (2022.01);
(Continued)

(58) Field of Classification Search
CPC .............. G06V 40/1318; G06K 9/0004; H01L 27/3234; H01L 27/3227; H01L 25/167
See application file for complete search history.

(56) References Cited

U.S. PATENT DOCUMENTS 7,787,082 B2 *   8/2010   Ito ........................... G06F 3/042
                                                    257/E31.127
8,610,234 B2 *  12/2013   Kim ..................... H01L 27/1461
                                                    257/E33.076
(Continued)

FOREIGN PATENT DOCUMENTS

CN    109074492 A       12/2018
CN    109541839 A   *   3/2019    ......... G02F 1/13338
(Continued)

*Primary Examiner* — Yuzhen Shen

(57) ABSTRACT

A texture recognition apparatus and a manufacturing method thereof are provided. The texture recognition apparatus includes a base substrate, a light source array and an image sensor array. The light source array is on a side of the base substrate and includes a plurality of light sources; the image sensor array is on a side of the base substrate and includes a plurality of image sensors, the plurality of image sensors are configured to receive light emitted from the plurality of light sources and reflected to the plurality of image sensors by a texture for texture collection; at least part of an photosensitive element of at least one image sensor of the plurality of image sensors is inclined relative to a surface of the base substrate.

17 Claims, 10 Drawing Sheets

(51) Int. Cl.
  *G06V 40/13* (2022.01)
  *H10K 59/124* (2023.01)
  *H10K 71/00* (2023.01)
  *H10K 59/12* (2023.01)

(52) U.S. Cl.
  CPC ........... *H10K 59/124* (2023.02); *H10K 71/00* (2023.02); *H10K 59/1201* (2023.02)

(56) References Cited

U.S. PATENT DOCUMENTS

| | | | | |
|---|---|---|---|---|
| 2006/0011913 | A1* | 1/2006 | Yamazaki | H01L 27/1214 257/53 |
| 2018/0033835 | A1* | 2/2018 | Zeng | H10K 59/40 |
| 2018/0308864 | A1* | 10/2018 | Kim | H01L 29/786 |
| 2019/0237521 | A1 | 8/2019 | Ju | |
| 2020/0065550 | A1 | 2/2020 | He et al. | |
| 2020/0242319 | A1* | 7/2020 | Zeng | G06V 40/1318 |

FOREIGN PATENT DOCUMENTS

| | | |
|---|---|---|
| CN | 109541839 A | 3/2019 |
| CN | 110633695 A | 12/2019 |
| CN | 111191613 A | 5/2020 |

\* cited by examiner

TEXTURE RECOGNITION APPARATUS AND MANUFACTURING METHOD THEREOF

This application is a U.S. National Phase Entry of International Application No. PCT/CN2021/087583, filed on Apr. 15, 2021, designating the United States of America and claiming priority to Chinese Patent Application No. 202010461620.0, filed on May 27, 2020. The present application claims priority to and the benefit of the above-identified applications and the above-identified applications are incorporated by reference herein in their entirety.

TECHNICAL FIELD

Embodiments of the present disclosure relate to a texture recognition apparatus and a manufacturing method thereof.

BACKGROUND

With increasing popularity of mobile terminals, more and more users use mobile terminals to perform operations such as identity verification, electronic payment and so on. Because of the uniqueness of skin textures such as fingerprint patterns or palm print patterns, fingerprint recognition technology combined with optical imaging is gradually adopted by mobile electronic devices for identity verification, electronic payment, etc. How to design a more optimized texture recognition apparatus is a focus problem in the art.

SUMMARY

At least one embodiment of the present disclosure provides a texture recognition apparatus, the texture recognition apparatus comprises a base substrate, a light source array and an image sensor array. The light source array is on a side of the base substrate and comprises a plurality of light sources; the image sensor array is on a side of the base substrate and comprises a plurality of image sensors, the plurality of image sensors are configured to receive light emitted from the plurality of light sources and reflected to the plurality of image sensors by a texture for texture collection; at least part of a photosensitive element of at least one image sensor of the plurality of image sensors is inclined relative to a surface of the base substrate.

For example, the texture recognition apparatus provided by at least an embodiment of the present disclosure further comprises a first insulation layer, the first insulation layer is on a side of the base substrate and comprises a plurality of first openings, at least one side wall of at least one of the plurality of first openings is inclined relative to the surface of the base substrate, and photosensitive elements of the plurality of image sensors are respectively in the plurality of first openings, so that a portion of the photosensitive element of the at least one image sensor on the at least one side wall is inclined relative to the surface of the base substrate.

For example, in the texture recognition apparatus provided by at least an embodiment of the present disclosure, the photosensitive element of the at least one image sensor comprises a first portion inclined relative to the surface of the base substrate, and comprises a second portion and a third portion that are respectively on two opposite sides of the first portion, and both the second portion and the third portion are parallel to the surface of the base substrate.

For example, in the texture recognition apparatus provided by at least an embodiment of the present disclosure, the at least part of the photosensitive element of at least one image sensor of the plurality of image sensors has an inclination angle ranging from 40° to 70° relative to the surface of the base substrate.

For example, the texture recognition apparatus provided by at least an embodiment of the present disclosure further comprises a controller, the controller is configured to control the light source array to operate to provide a first photosensitive light source at first time, the plurality of image sensors comprise a first group of image sensors, and the first group of image sensors is configured to receive light emitted from the first photosensitive light source and reflected to the first group of image sensors by a texture to form a first imaging range, at least part of a photosensitive element of each image sensor in the first group of image sensors is inclined relative to the surface of the base substrate, so that the light reflected to the first group of image sensors by the texture tends to vertically enter a light incident side surface of the at least part of the photosensitive element of each image sensor in the first group of image sensors.

For example, in the texture recognition apparatus provided by at least an embodiment of the present disclosure, the first group of image sensors comprises a first image sensor and a second image sensor, the first image sensor is closer to the first photosensitive light source than the second image sensor, an inclination angle of a photosensitive element of the first image sensor relative to the surface of the base substrate is less than or equal to an inclination angle of a photosensitive element of the second image sensor relative to the surface of the base substrate.

For example, in the texture recognition apparatus provided by at least an embodiment of the present disclosure, the controller is further configured to control the light source array to operate to provide a second photosensitive light source at the first time or at second time different from the first time, the plurality of image sensors comprise a second group of image sensors, the second group of image sensors is configured to receive light emitted from the second photosensitive light source and reflected to the second group of image sensors by a texture to form a second imaging range, and the second imaging range is different from the first imaging range, at least part of a photosensitive element of each image sensor in the second group of image sensors is inclined relative to the surface of the base substrate, so that the light reflected to the second group of image sensors by the texture tends to vertically enter a light incident side surface of the at least part of the photosensitive element of each image sensor in the second group of image sensors.

For example, in the texture recognition apparatus provided by at least an embodiment of the present disclosure, the second group of image sensors comprises a third image sensor and a fourth image sensor, the third image sensor is closer to the second photosensitive light source than the fourth image sensor, an inclination angle of a photosensitive element of the third image sensor relative to the surface of the base substrate is less than or equal to an inclination angle of a photosensitive element of the fourth image sensor relative to the surface of the base substrate.

For example, in the texture recognition apparatus provided by at least an embodiment of the present disclosure, the first imaging range is in a first ring shape and the second imaging range is in a second ring shape; the second ring at least partially covers a central part of the first ring shape, or the second ring shape is tangent to the first ring shape.

For example, the texture recognition apparatus provided by at least an embodiment of the present disclosure further comprises a display panel, the display panel comprises a pixel array, and the pixel array comprises a plurality of sub-pixels arranged in an array; the light source array comprises the pixel array, and the plurality of light sources comprise the plurality of sub-pixels.

For example, in the texture recognition apparatus provided by at least an embodiment of the present disclosure, the pixel array comprises a drive circuit layer on the base substrate and a light emitting device layer on a side of the drive circuit layer away from the base substrate, each of the plurality of image sensors comprises a photosensitive element and a switch element configured to control the photosensitive element, wherein the photosensitive element is between the drive circuit layer and the light emitting device layer, and the switch element is in the drive circuit layer.

For example, in the texture recognition apparatus provided by at least an embodiment of the present disclosure, the plurality of sub-pixels comprise a first group of sub-pixels, and the first group of sub-pixels comprises a plurality of first light emitting devices in the light emitting device layer, the controller is configured to light up the first group of sub-pixels at the first time to provide the first photosensitive light source; the light incident side surface of the at least part of each image sensor in the first group of image sensors faces the plurality of first light emitting devices.

For example, in the texture recognition apparatus provided by at least an embodiment of the present disclosure, the first group of sub-pixels are arranged in a dot shape, a line shape or a pattern to form a dot-shaped, line-shaped or a patterned first photosensitive light source.

At least one embodiment of the present disclosure further provides a manufacturing method of a texture recognition apparatus, the manufacturing method comprises: provide a base substrate; forming a light source array on a side of the base substrate, in which the light source array comprises a plurality of light sources; and forming an image sensor array on a side of the base substrate, in which the image sensor array comprises a plurality of image sensors, the plurality of image sensors are configured to receive light emitted from the plurality of light sources and reflected to the plurality of image sensors by a texture for texture collection, at least part of a photosensitive element of at least one image sensor of the plurality of image sensors is formed to be inclined relative to a surface of the base substrate.

For example, in the manufacturing method provided by at least an embodiment of the present disclosure, forming the image sensor array comprises: forming a first insulation layer on a side of the base substrate, in which the first insulation layer comprises a plurality of first openings, and at least one side wall of at least one of the plurality of first openings is inclined relative to the surface of the base substrate, and forming photosensitive elements of the plurality of image sensors respectively in the plurality of first openings, so that a portion of the photosensitive element of the at least one image sensor on the at least one side wall is inclined relative to the surface of the base substrate.

For example, in the manufacturing method provided by at least an embodiment of the present disclosure, an inclination angle of the at least one side wall relative to the surface of the base substrate ranges from 40° to 70°.

For example, in the manufacturing method provided by at least an embodiment of the present disclosure, the first insulation layer comprises a photoresist material, and forming the first insulation layer comprises: forming a photoresist material layer on a side of the base substrate, performing an exposure process on the photoresist material layer by using a mask, in which the mask comprises a light-transmitting portion and a light-shielding portion, and the light-transmitting portion corresponds to the plurality of first openings, and performing a development process on the photoresist material layer.

For example, the manufacturing method provided by at least an embodiment of the present disclosure further comprises: forming a display panel, wherein forming the display panel comprises forming a pixel array comprising a plurality of sub-pixels arranged in an array; the light source array comprises the pixel array, and the plurality of light sources comprise the plurality of sub-pixels.

For example, in the manufacturing method provided by at least an embodiment of the present disclosure, forming the pixel array comprises: forming a drive circuit layer on the base substrate, and forming a light emitting device layer on a side of the drive circuit layer away from the base substrate, in which each of the plurality of image sensors comprises a photosensitive element and a switch element configured to control the photosensitive element, and the photosensitive element is formed between the drive circuit layer and the light emitting device layer, and the switch element is formed in the drive circuit layer.

For example, the manufacturing method provided by at least an embodiment of the present disclosure further comprises: providing a controller, in which the controller is coupled with the light source array and configured to control the light source array to operate at first time to provide a first photosensitive light source, the plurality of image sensors comprise a first group of image sensors, and the first group of image sensors is configured to receive light emitted from the first photosensitive light source and reflected to the first group of image sensors by a texture to form a first imaging range, at least part of a photosensitive element of each image sensor in the first group of image sensors is formed to be inclined relative to the surface of the base substrate, so that the light reflected to the first group of image sensors by the texture tends to vertically enter a light incident side surface of the at least part of the photosensitive element of each image sensor in the first group of image sensors; and the first group of image sensors comprises a first image sensor and a second image sensor, wherein the first image sensor is closer to the first photosensitive light source than the second image sensor, and an inclination angle of the first image sensor relative to the surface of the base substrate is formed to be less than or equal to an inclination angle of the second image sensor relative to the surface of the base substrate.

BRIEF DESCRIPTION OF THE DRAWINGS

In order to clearly illustrate the technical solutions of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

Figure 1A:
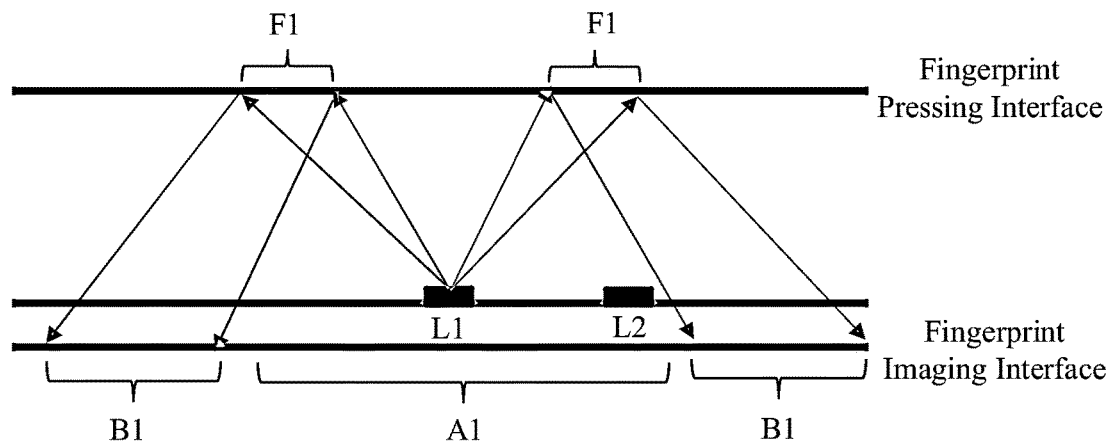
FIG. 1A is a schematic diagram of the principle of fingerprint imaging.

In order to make objects, technical solutions and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment (s), without any inventive work, which should be within the scope of the disclosure.

Unless otherwise defined, all the technical and scientific terms used herein have the same meanings as commonly understood by one of ordinary skill in the art to which the present disclosure belongs. The terms "first" "second" etc., which are used in the present disclosure, are not intended to indicate any sequence, amount or importance, but distinguish various components. Also, the terms "comprise" "comprising" "include" "including" and the like are intended to specify that the elements or the objects stated before these terms encompass the elements or the objects and equivalents thereof listed after these terms, but do not preclude other elements or objects. The phrases "connect", "connected", and the like are not intended to define a physical connection or mechanical connection, but may comprise an electrical connection, directly or indirectly. "On," "under," "left," "right" and the like are only used to indicate relative position relationship, and when the position of the object which is described is changed, the relative position relationship may be changed accordingly.

At present, the narrow border is gradually becoming a mainstream for the design and manufacture of a display apparatus, especially for a portable display apparatus such as a mobile phone. One means to realize the narrow border is to integrate image sensors with a fingerprint recognition function into the display apparatus, so as to realize the under-screen fingerprint recognition mode and increases an area of a display region of the display apparatus, and thus increasing the screen proportion.

For example, a point light source, a line light source or a light source with a certain pattern, etc. can be used as a photosensitive light source of an image sensor for fingerprint recognition. In addition, the light source and the image sensor may be arranged in various ways, for example, the light source may be arranged on a side of the image sensor close to the fingerprint touch side, or the light source may be arranged on the same plane as the image sensor, or the light source may also be arranged on a side of the image sensor away from the fingerprint touch side. The arranging modes of the light source and the image sensor can be selected according to different requirements.

The principle of fingerprint recognition is described in the following by taking the case that a point light source is taken as the photosensitive light source of the image sensor, and the light source is arranged on the side of the image sensor close to the fingerprint touch side as an example, but this does not limit the embodiments of the present disclosure.

In a reflective optical fingerprint recognition apparatus, in a fingerprint recognition process, as illustrated in FIG. 1A, when a point light source L1 emits light, the light emitted by the point light source L1 irradiates a fingerprint pressing interface (e.g., an outer surface of a glass screen) at different angles, because of total reflection on the fingerprint pressing interface, a part of the light whose incident angle is larger than or equal to the critical angle θ of the total reflection undergoes total reflection, which results in that this part of the light is not able to exit from the fingerprint pressing interface, thus generating a total reflection region. Correspondingly, a part of the light whose incident angle is smaller than the critical angle θ of the total reflection exits from the fingerprint pressing interface. Therefore, a texture image can be collected by light reflected by the total reflection region, for example, a clear texture image is formed at a region B1 of the fingerprint imaging interface where the image sensor is located, the texture image corresponds to a part of the fingerprint at a region F1, the region F1 is the total reflection region, and the region B1 is an imaging region.

Specifically, for example, when a fingerprint of a user's finger presses the total reflection region F1, ridges of the fingerprint touch a surface of the total reflection region F1, so that the total reflection condition of positions corresponding to the ridges of the fingerprint is destroyed, and therefore light exits at the corresponding positions, so that an original reflection path is changed, while valleys of the fingerprint do not touch the surface of the total reflection region F1, so that the total reflection condition of positions corresponding to the valleys of the fingerprint is not destroyed, and light is still totally reflected at the corresponding positions, and thus the original reflection path is not changed. In this way, because of the different influences of the valleys and the ridges of the fingerprint on the total reflection condition of the light in the total reflection region, light incident on the fingerprint imaging interface forms a texture image with alternate bright and dark portions at different positions.

In addition, because of the interference caused by the light emitted out from the fingerprint pressing interface and then reflected by the fingerprint or the like, or because the light emitted by the light source is reflected to the fingerprint imaging interface by other functional layers before reaching the fingerprint pressing interface, a region A1 of the fingerprint imaging interface becomes an invalid detection region, and an effective texture image cannot be formed in this region. In the invalid region A1, a part of the light emitted by the light source L1 and then reflected to the fingerprint imaging interface by other functional layers before reaching the fingerprint pressing interface and a part of the light emitted by the light source L1 that is almost vertically reflected by the fingerprint pressing interface have higher brightness and are basically in a center position of the invalid region A1, and therefore a highlight region is formed. Because the highlight region has a higher brightness, a larger photoelectric signal is generated in a part of the image sensor array corresponding to the highlight region, which is easy to form a residual image, thus the highlight region is also known as a residual image region.

Figure 1B:
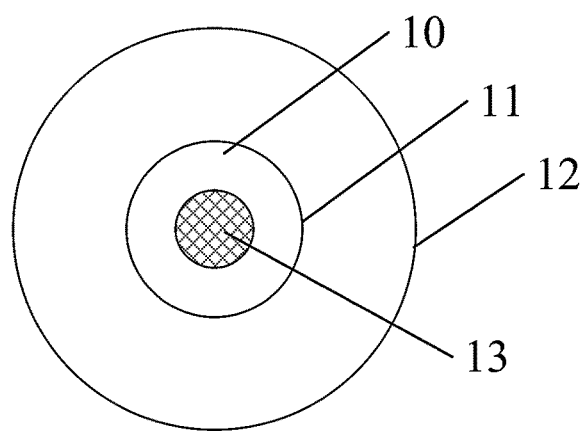
FIG. 1B is a schematic diagram of an imaging range of a point light source.

For example, FIG. 1B illustrates a schematic diagram of an imaging range of a point light source. As illustrated in FIG. 1B, in a photosensitive range of the point light source, an effective imaging range is in a ring shape, that is, in FIG. 1B, a ring region between an inner circle 11 and an outer circle 12 is the effective imaging range which corresponds to the imaging region B1 corresponding to the total reflection region F1 in FIG. 1A; a region (hereinafter referred to as a ring center 10) within the inner circle 11 of the ring shape is the invalid imaging region, which corresponds to the invalid region A1 in FIG. 1A; a part of the region (the shaded region) 13 inside the ring center 10 is the highlight region (residual image region), and it is easy to cause a residual image in the highlight region by the image sensor array during imaging.

Figure 1C:
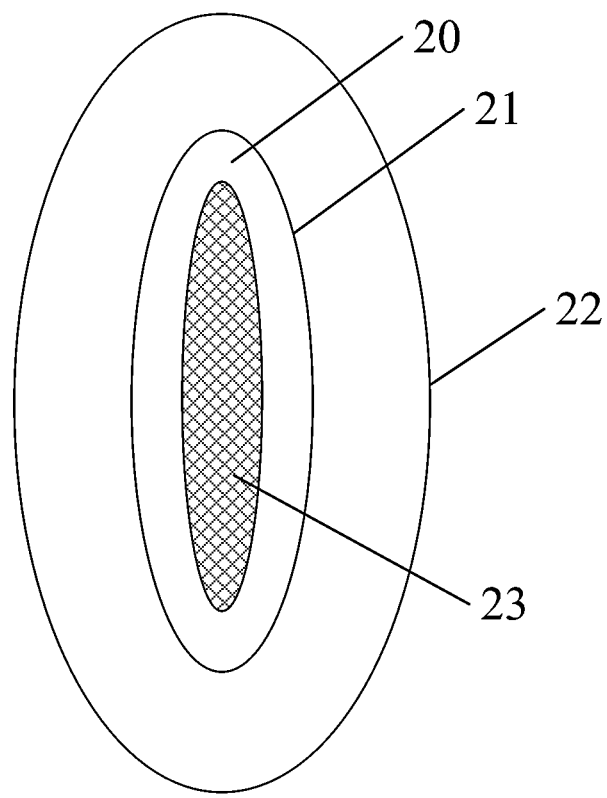
FIG. 1C is a schematic diagram of an imaging range of a line light source.

Similarly, FIG. 1C shows a diagram of an imaging range of a line light source. As illustrated in FIG. 1C, the effective imaging range of a line light source is a racetrack-shaped ring region or a long oval-shaped ring region between an inner circle 21 and an outer circle 22, a ring center 20 is the invalid imaging region, and a part of the region (the shaded region) 23 inside the ring center 10 is the highlight region (residual image region) that is easy to cause a residual image by the image sensor array during imaging.

Figure 2:
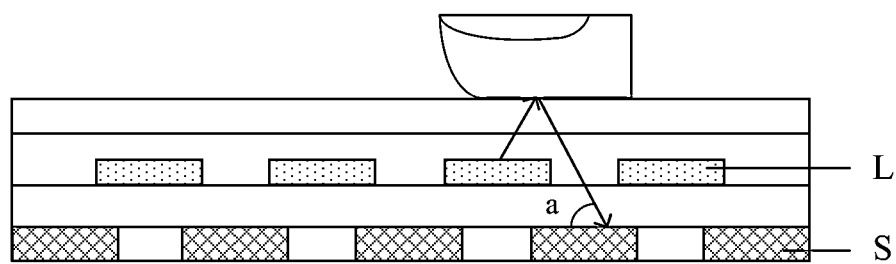
FIG. 2 is a schematic cross-sectional view of a texture recognition apparatus.

FIG. 2 shows a schematic cross-sectional view of a texture recognition apparatus. As shown in FIG. 2, a sensing side surface of an image sensor S is parallel to a texture touch surface of the texture recognition apparatus. When light emitted by a light source L is reflected by the texture and irradiated on the image sensor S, incident light has a certain angle A relative to the image sensor S, and the angle A is usually an acute angle, that is, the incident light is not vertically incident to the image sensor S. Because the sensing side surface of the image sensor S is limited, the image sensor S may not receive enough light signals, thus affecting collection and recognition of the texture.

At least one embodiment of the present disclosure provides a texture recognition apparatus, the texture recognition apparatus comprises a base substrate, a light source array and an image sensor array. The light source array is on a side of the base substrate and comprises a plurality of light sources; the image sensor array is on a side of the base substrate and comprises a plurality of image sensors, the plurality of image sensors are configured to receive light emitted from the plurality of light sources and reflected to the plurality of image sensors by a texture for texture collection; at least part of an photosensitive element of at least one image sensor of the plurality of image sensors is inclined relative to a surface of the base substrate. Therefore, the light emitted from the plurality of light sources and reflected by the texture tends to vertically enter the image sensor, so that the utilization rate of the light emitted by the plurality of light sources by the image sensor can be improved. Moreover, in the same setting space, the image sensor can have a larger sensing surface area, so that the image sensor can receive enough light signals for texture collection and recognition.

The texture recognition apparatus and a manufacturing method thereof provided by embodiments of the present disclosure are described exemplarily by several specific embodiments.

Figure 3:
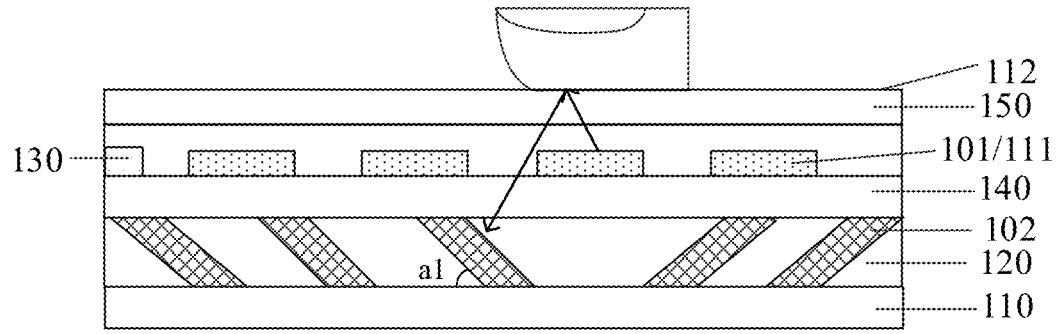
FIG. 3 is a schematic cross-sectional view of a texture recognition apparatus provided by at least one embodiment of the present disclosure.

At least one embodiment of the present disclosure provides a texture recognition apparatus. FIG. 3 shows a schematic cross-sectional view of the texture recognition apparatus. As shown in FIG. 3, the texture recognition apparatus 100 includes a base substrate 110, a light source array and an image sensor array. The light source array is arranged on a side (shown as an upper side in the figure) of the base substrate 110, and includes a plurality of light sources 101 arranged in an array in a predetermined region. The image sensor array is arranged on a side (shown as the upper side in the figure) of the base substrate 110, and includes a plurality of image sensors 102 arranged in an array in a predetermined region. The plurality of image sensors 102 are configured to receive light emitted from the plurality of light sources 101 and then reflected to the plurality of image sensors 102 by a texture for texture collection. At least part of a photosensitive element of at least one image sensor 102 of the plurality of image sensors 102 is inclined relative to a surface of the base substrate 110. For example, at least part of the photosensitive element of each image sensor 102 of the plurality of image sensors 102 is inclined relative to the surface of the base substrate 110.

In this way, the light emitted from the plurality of light sources 101 and reflected by the texture tends to vertically enter the photosensitive elements of the image sensors 102, so that the utilization ratio of the light emitted by the plurality of light sources 101 by the image sensors 102 can be improved. Moreover, in the same setting space, the inclined arrangement of the photosensitive element can make the image sensor 102 have a larger sensing surface area, so that the image sensor 102 can receive enough light signals for texture collection and recognition.

The texture recognition apparatus 100 can be used for collecting textures, such as fingerprints or palmprints, for fingerprint recognition or palmprint recognition. For example, the texture recognition apparatus 100 has a touch side 112 (shown as an upper side of the texture recognition apparatus 100 in FIG. 2). When an operator with a texture, such as an operator's finger, touches the touch side 112 of the texture recognition apparatus 100, the texture recognition apparatus 100 starts to collect the texture.

For example, as shown in FIG. 3, the texture recognition apparatus 100 includes a cover plate 150, and for example, the cover plate 15 is a glass cover plate which can encapsulate and protect the texture recognition apparatus 100. For example, a surface of the cover plate 150 is the touch side 112. When an operator with a texture such as a finger touches the touch side 112 of the texture recognition apparatus 100, the light source array works, and the light emitted by the light sources 101 can be reflected by the operator after reaching the operator, and for example, the reflected light reaches the image sensor 102 through the gap between the light sources 101 in the light source array, and the image sensor 102 can collect a texture image of the operator.

As mentioned above, the operator with the texture may be a hand, and the texture recognized by the image sensor 102 is a skin texture, such as fingerprint, palmprint, and the like. In addition, the operator with the texture may also be an inanimate object with a certain texture, for example, an object with a certain texture made of a resin or other materials, the embodiments of the present disclosure are not limited in this aspect.

For example, in some embodiments, the image sensor array may be arranged on a side of the light source array away from the touch side 112, and the image sensor array and the light source array may be arranged on the same side or different sides of the base substrate 110. In the case where the image sensor array and the light source array are arranged on the same side of the base substrate 110, as shown in FIG. 3, a planarization layer 140 may be arranged between the image sensor array and the light source array to planarize the surface on which the light source array is arranged. For example, in other embodiments, the image sensor array may be arranged in the same layer as the light source array, for example, the plurality of image sensors 102 included in the image sensor array and the light sources 101 are arranged at intervals in the same layer. For another example, the light source array may be arranged on a side of the image sensor array away from the touch side. In this case, the light emitted by the light sources 101 can be emitted out from a gap of adjacent image sensors 102 and reflected to the image sensors 102 by the texture. The embodiments of the present disclosure do not specifically limit the arrangement mode and the arrangement position of the image sensor array and the light source array relative to the base substrate 110, as long as it can be realized that the plurality of image sensors 102 can receive the light emitted from the light sources 101 and then reflected to the image sensors 102 by the texture for texture collection.

For example, in some embodiments, as shown in FIG. 3, the texture recognition apparatus further comprises a first insulation layer 120, the first insulation layer 120 is arranged on a side (shown as the upper side in the figure) of the base substrate 110, the first insulation layer 120 comprises a plurality of first openings, at least one side wall 1201 of at least one of the plurality of first openings is inclined relative to the surface of the base substrate 110, and photosensitive elements of the plurality of image sensors 102 are respectively arranged in the plurality of first openings, so that a portion of the photosensitive element of at least one image sensor 102 located on the at least one side wall 1201 is inclined relative to the surface of the base substrate 110. The arrangement of the first insulation layer 120 is helpful to form an inclined photosensitive element in the manufacturing process of the texture recognition apparatus.

Figure 4:
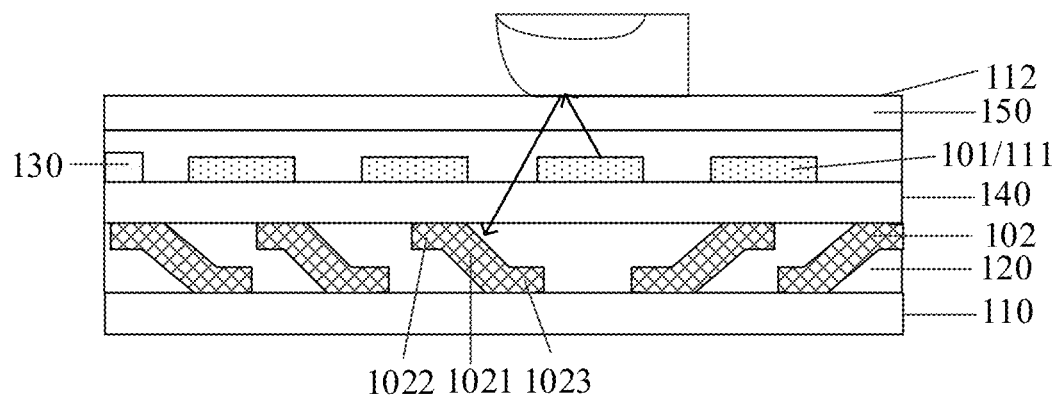
FIG. 4 is a schematic cross-sectional view of another texture recognition apparatus provided by at least one embodiment of the present disclosure.

For example, part of the photosensitive element of at least one image sensor 102 is inclined relative to the surface of the base substrate 110, or an entirety of the photosensitive element of at least one image sensor 102 is inclined relative to the surface of the base substrate 110. In some embodiments, as shown in FIG. 4, the photosensitive element of at least one image sensor 102 includes a first portion 1021 that is inclined relative to the surface of the base substrate 110, and includes a second portion 1022 and a third portion 1023 that are respectively located on two opposite sides of the first portion 1021, both of the second portion 1022 and the third portion 1023 are parallel to the surface of the base substrate 110. For example, the second portion 1022 and the third portion 1023 are respectively configured to be electrically connected with a drive circuit. Because the second portion 1022 and the third portion 1023 are parallel to the surface of the base substrate 110, it is easier to form electrical connection structures, such as vias, wires or electrodes, at the positions of the second portion 1022 and the third portion 1023 in the manufacturing process of the texture recognition apparatus, so as to facilitate the electrical connection between the image sensor 102 and the drive circuit.

For example, in some embodiments, as shown in FIG. 3, at least part of the photosensitive element of at least one image sensor 102 of the plurality of image sensors 102 has an inclination angle ranging from 40° to 70° relative to the surface of the base substrate 110, such as 45°, 50°, 55°, 60° or 65°, etc. Through research, in the case where the inclination angle of the photosensitive element of the image sensor 102 is the above angle, the light emitted from the plurality of light sources 101 and then reflected by the texture tends to vertically enter the photosensitive element of the image sensor 102, thus the utilization ratio of the light emitted by the plurality of light sources 101 by the image sensor 102 can be sufficiently improved.

Figure 5:
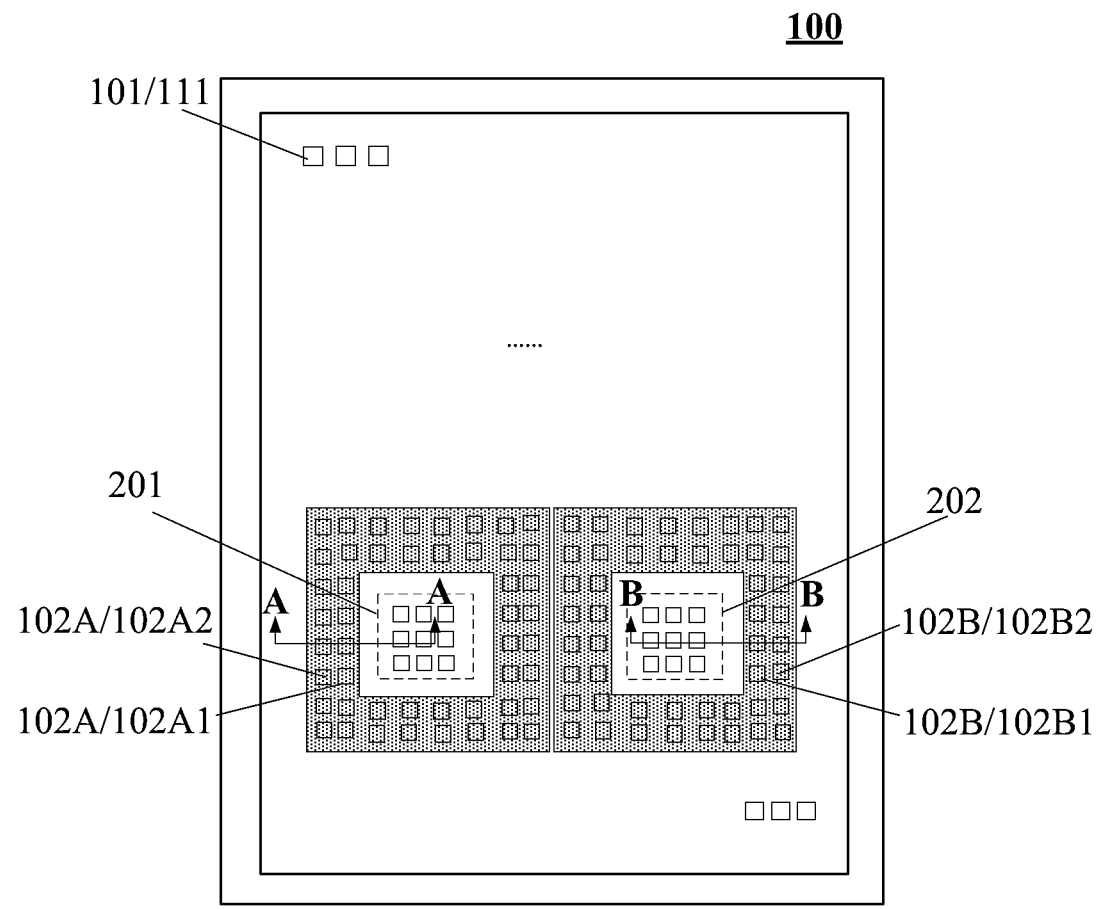
FIG. 5 is a schematic planar view of a texture recognition apparatus provided by at least one embodiment of the present disclosure.

For example, FIG. 5 shows a schematic planar view of a texture recognition apparatus 100. In some embodiments, as shown in FIG. 4 and FIG. 5, the texture recognition apparatus further includes a controller 130, and the controller 130 is configured to control the light source array to operate to provide a first photosensitive light source 201 at first time. The plurality of image sensors 1102 include a first group of image sensors 102A, and the first group of image sensors 102A is configured to receive light emitted from the first photosensitive light source 201 and then reflected to the first group of image sensors 102A by a texture to form a first imaging range 301. For example, at least part of the photosensitive element of each image sensor 102 in the first group of image sensors 102A is inclined relative to the surface of the base substrate 110, so that the light reflected by the texture to the first group of image sensors 102A tends to be vertically incident on at least part of a light incident side surface of the photosensitive element of each image sensor 102 in the first group of image sensors 102A.

For example, the first photosensitive light source 201 includes one or more light sources 101. In the case where the first photosensitive light source 201 includes one light source 101, the first photosensitive light source 201 is formed as a dot-shaped photosensitive light source. In the case where the first photosensitive light source 201 includes a plurality of light sources 101, the plurality of light sources 101 may be arranged in a dot shape, a line shape or a pattern, in this case, the first photosensitive light source 201 is formed as a dot-shaped photosensitive light source, a line-shaped photosensitive light source or a patterned photosensitive light source.

Figure 6:
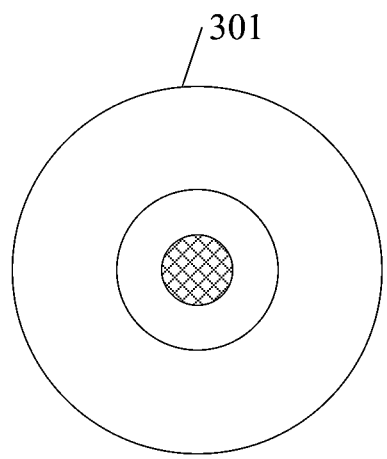
FIG. 6 is a schematic diagram of an imaging range of a first photosensitive light source in FIG. 5.

For example, in the case where the first photosensitive light source 201 is formed as a dot-shaped photosensitive light source, one first photosensitive light source 201 may include (3×3)-(7×7) light sources 101 arranged in an array, such as 4×4 light sources 101 or 5×5 light sources 101 arranged in an array, or the like. For example, in the example shown in FIG. 5, one first photosensitive light source 201 includes 3×3 light sources 101 arranged in an array to form a dot-shaped photosensitive light source, and in this case, as shown in FIG. 6, the first imaging range 301 of the first photosensitive light source 201 on the image sensor array is in a first ring shape. In other embodiments, in the case where the first photosensitive light source 201 is formed as a line-shaped photosensitive light source, one first photosensitive light source 201 may include 3×7 light sources 101 arranged in an array or 2×6 light sources 101 arranged in an array, or the like. In the case where the first photosensitive light source 201 is formed as a patterned photosensitive light source, the plurality of light sources 101 included in the first photosensitive light source 201 may be arranged in a shape of a letter Z or a shape of a Chinese character "回", or the like. The embodiments of the present disclosure do not limit the shape of the photosensitive light source.

For example, in some embodiments, as shown in FIG. 5, the first group of image sensors 102A includes a first image sensor 102A1 and a second image sensor 102A2, the first image sensor 102A1 is closer to the first photosensitive light source 201 than the second image sensor 102A2, and an inclination angle of the photosensitive element of the first image sensor 102A1 relative to the surface of the substrate 110 is less than or equal to an inclination angle of the photosensitive element of the second image sensor 102A2 relative to the surface of the substrate 110.

Figure 7:
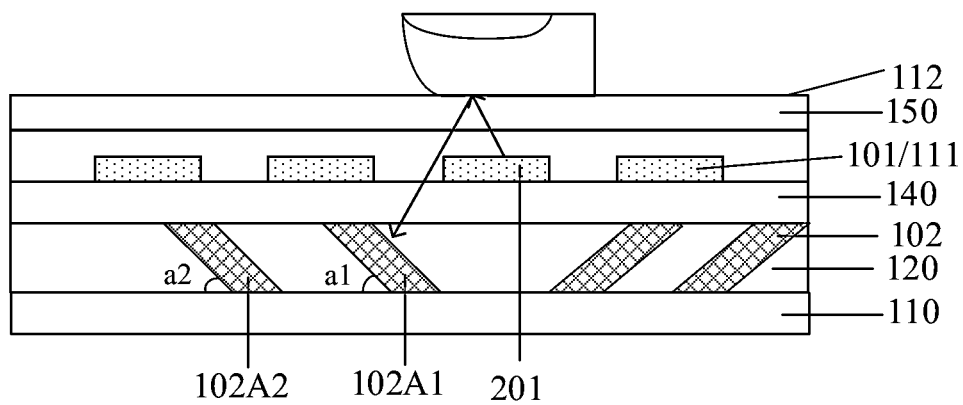
FIG. 7 is a schematic cross-sectional view of the texture recognition apparatus in FIG. 5 taken along the line A-A.
Figure 8:
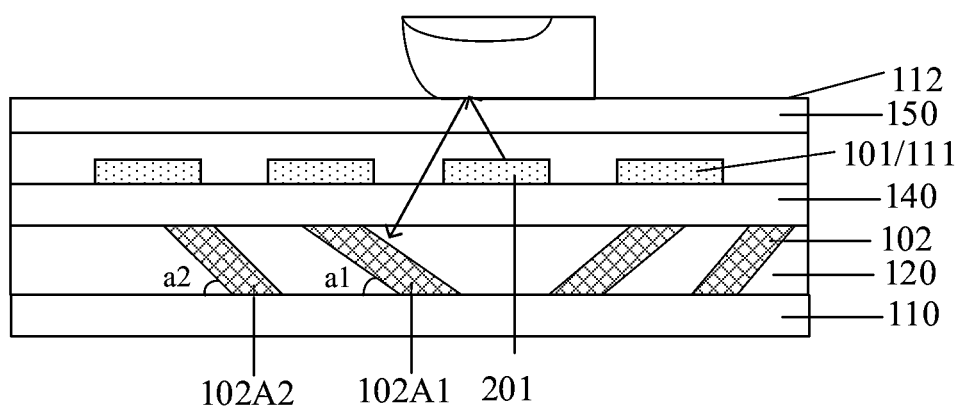
FIG. 8 is another schematic cross-sectional view of the texture recognition apparatus in FIG. 5 taken along the line A-A.

For example, FIG. 7 and FIG. 8 are schematic cross-sectional views of the texture recognition apparatus 100 in FIG. 5 respectively taken along the line A-A. In some examples, as shown in FIG. 7, the first image sensor 102A1 is closer to the first photosensitive light source 201 than the second image sensor 102A2, and an inclination angle a1 of the photosensitive element of the first image sensor 102A1 relative to the surface of the base substrate 110 is equal to an inclination angle a2 of the photosensitive element of the second image sensor 102A2 relative to the surface of the base substrate 110. For example, all the photosensitive elements of the plurality of image sensors 102 included in the first group of image sensors 102A have the same inclination angle relative to the surface of the base substrate 110, thereby facilitating the simplification of the manufacturing process of the texture recognition apparatus.

In other examples, as shown in FIG. 8, the first image sensor 102A1 is closer to the first photosensitive light source 201 than the second image sensor 102A2, and the inclination angle a1 of the first image sensor 102A1 relative to the surface of the base substrate 110 is smaller than the inclination angle a2 of the second image sensor 102A2 relative to the surface of the base substrate 110. For example, among the plurality of image sensors 102 included in the first group of image sensors 102A, the photosensitive elements of the image sensors 102 with the same distance from the first photosensitive light source 201 have the same inclination angle relative to the surface of the base substrate 110, and the farther away from the first photosensitive light source 201, the larger the inclination angle of the photosensitive element of the image sensor 102 relative to the surface of the base substrate 110. Therefore, the inclination angle of the photosensitive element of the image sensor 102 can be set according to the distance between the image sensor 102 and the first photosensitive light source 201, so that the light reflected by the texture to the first group of image sensors 102A tends to be vertically incident on each image sensor 102 in the first group of image sensors 102A, thereby maximizing the light utilization rate of each image sensor 102.

For example, in some embodiments, in the case where the size of the texture is large and the imaging range provided by one photosensitive light source is not enough to meet the requirement of texture recognition, as shown in FIG. 5, the controller 130 is further configured to control the light source array to operate to provide a second photosensitive light source 202 at the first time or second time different from the first time, and the plurality of image sensors 102 include a second group of image sensors 102B. The second group of image sensors is configured to receive light emitted from the second photosensitive light source 202 and reflected to the second group of image sensors 102B by the texture to form a second imaging range, and the second imaging range is different from the first imaging range. The second imaging range and the first imaging range can be used together to imaging the texture. For example, at least part of the photosensitive element of each image sensor 102 in the second group of image sensors 102B is inclined relative to the surface of the base substrate 110, so that the light reflected by the texture to the second group of image sensors 102B tends to be vertically incident on at least part of a light incident side surface of the photosensitive element of each image sensor 102B in the second group of image sensors 102B.

Figure 9A:
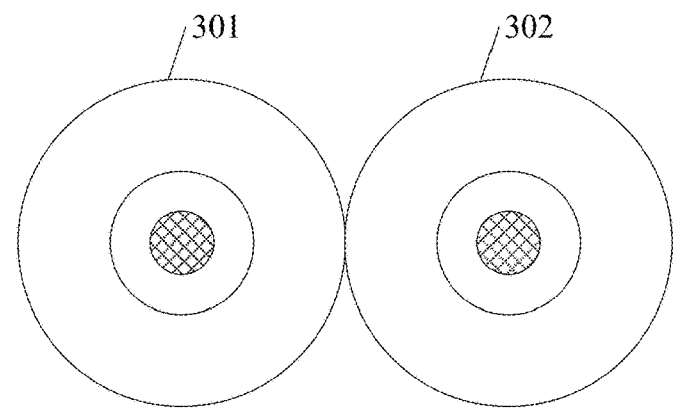
FIGS. 9A-9C are schematic diagrams of imaging ranges of a first photosensitive light source and a second photosensitive light source provided by a texture recognition apparatus provided by at least one embodiment of the present disclosure.

For example, in the case where the controller 130 is configured to control the light source array to operate at the first time to provide the first photosensitive light source 201 and the second photosensitive light source 202, the number of sub-light sources 101 included in the first photosensitive light source 201 and the number of sub-light sources 101 included in the second photosensitive light source 202 may be the same, and in this case, as shown in FIG. 9A, the first imaging range 301 of the first photosensitive light source 201 on the image sensor array is in a first ring shape, a second imaging range 302 of the second photosensitive light source 202 on the image sensor array is in a second ring shape, the first ring shape is tangent to the second ring shape, and the first imaging range 301 and the second imaging range 302 can be used for imaging the texture together.

Figure 9B:
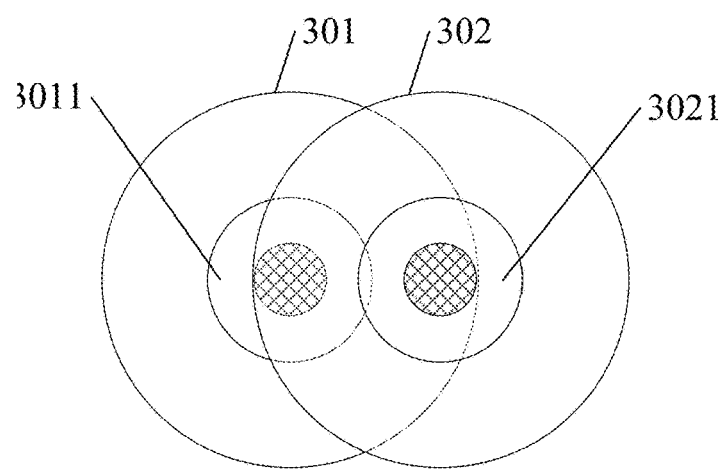
Figure 9C:
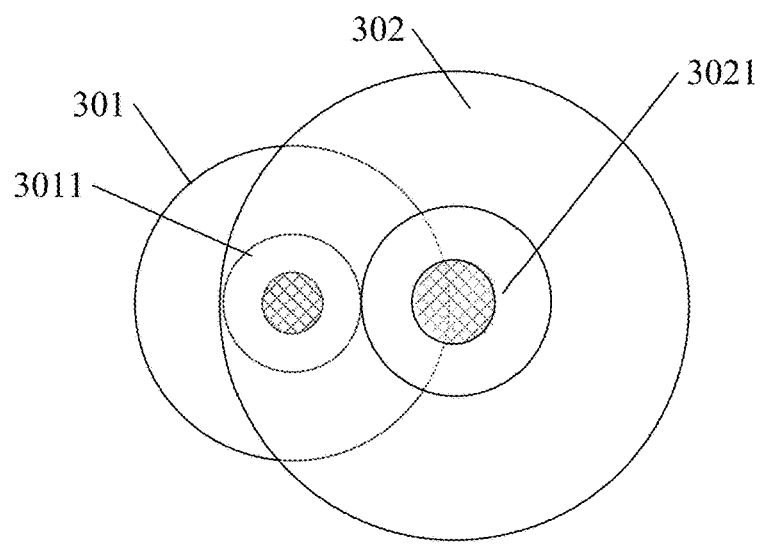

For example, in the case where the controller 130 is configured to control the light source array to operate at the first time to provide the first photosensitive light source 201 and control the light source array to operate at the second time to provide the second photosensitive light source 202, the number of the sub-light sources 101 included in the first photosensitive light source 201 and the number of the sub-light sources 101 included in the second photosensitive light source 202 may be the same, and in this case, as shown in FIG. 9B, the first imaging range 301 of the first photosensitive light source 201 on the image sensor array is in a first ring shape, the second imaging range 302 of the second photosensitive light source 202 on the image sensor array is in a second ring shape, and the second ring shape at least partially covers a central part of the first ring shape, so that the first imaging range 301 and the second imaging range 302 can complement each other to form a larger imaging range for imaging the texture. Or, in some examples, the number of the sub-light sources 101 included in the second photosensitive light source 202 is larger than the number of the sub-light sources 101 included in the first photosensitive light source 201, and in this case, as shown in FIG. 9C, the first imaging range 301 of the first photosensitive light source 201 on the image sensor array is in a first ring shape, the second imaging range 302 of the second photosensitive light source 202 on the image sensor array is in a second ring shape, and the second ring shape at least partially covers a central part of the first ring shape, so that the first imaging range 301 and the second imaging range 302 can complement each other to form a larger imaging range for imaging the texture.

For example, as shown in FIG. 5, the second group of image sensors 102B includes a third image sensor 102B1 and a fourth image sensor 102B2, the third image sensor 102B1 is closer to the second photosensitive light source 202 than the fourth image sensor 102B2, and an inclination angle of the third image sensor 102B1 relative to the surface of the base substrate 110 is less than or equal to an inclination angle of the fourth image sensor 102B2 relative to the surface of the base substrate 110.

Figure 10:
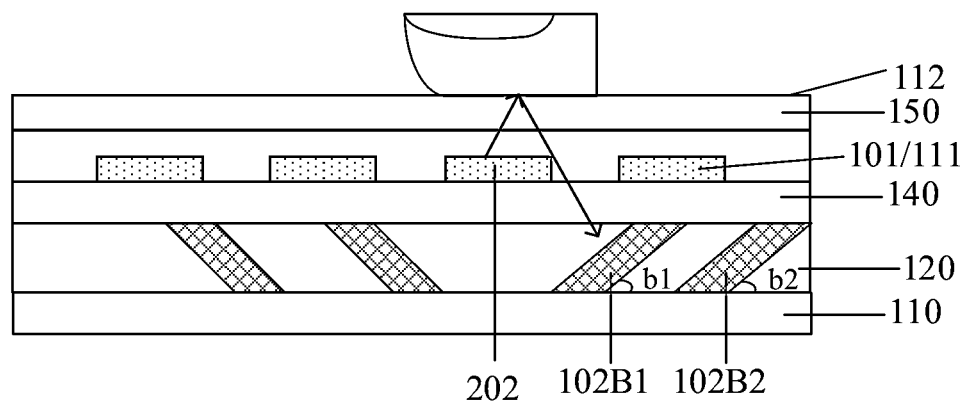
FIG. 10 is a schematic sectional view of the texture recognition apparatus of FIG. 5 taken along the line B-B.
Figure 11:
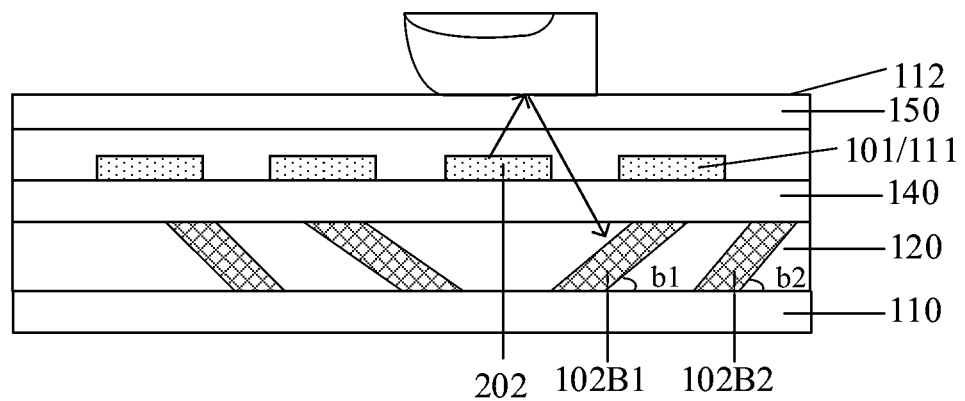
FIG. 11 is another schematic cross-sectional view of the texture recognition apparatus in FIG. 5 taken along the line B-B.

For example, FIG. 10 and FIG. 11 are schematic cross-sectional views of the texture recognition apparatus 100 in FIG. 5 respectively taken along the line B-B. In some examples, as shown in FIG. 10, the third image sensor 102B1 is closer to the second photosensitive light source 202 than the fourth image sensor 102B2, and an inclination angle b1 of the photosensitive element of the third image sensor 102B1 relative to the surface of the base substrate 110 is equal to an inclination angle b2 of the photosensitive element of the fourth image sensor 102B2 relative to the surface of the base substrate 110. For example, all the photosensitive elements of the plurality of image sensors 102 included in the second group of image sensors 102B have the same inclination angle relative to the surface of the base substrate 110, thereby facilitating the simplification of the manufacturing process of the texture recognition apparatus.

In other examples, as shown in FIG. 11, the third image sensor 102$b$1 is closer to the second photosensitive light source 202 than the fourth image sensor 102$b$2, and the inclination angle b1 of the third image sensor 102B1 relative to the surface of the base substrate 110 is smaller than the inclination angle b2 of the fourth image sensor 102B2 relative to the surface of the base substrate 110. For example, among the plurality of image sensors 102 included in the second group of image sensors 102B, the photosensitive elements of image sensors 102 with the same distance from the second photosensitive light source 202 all have the same inclination angle relative to the surface of the base substrate 110, and the farther away from the second photosensitive light source 202, the larger the inclination angle of the photosensitive element of the image sensor 102 relative to the surface of the base substrate 110. Therefore, the inclination angle of the photosensitive element of the image sensor 102 can be set according to the distance between the image sensor 102 and the second photosensitive light source 202, so that the light reflected by the texture to the second group of image sensors 102B tends to be vertically incident on each image sensor 102 in the second group of image sensors 102B.

For example, in some embodiments, in the case where the size of the texture is large and the first photosensitive light source and the second photosensitive light source are not enough to meet the requirement of texture recognition, a third photosensitive light source may further be provided at the first time or the second time, and the imaging range of the first photosensitive light source, the imaging range the second photosensitive light source and an imaging range the third photosensitive light source are used for imaging the texture together. Or, in some embodiments, a plurality of first photosensitive light sources arranged in an array are provided at the first time, a plurality of second photosensitive light sources arranged in an array are provided at the first time or at the second time different from the first time, and a plurality of imaging ranges formed by these photosensitive light sources are used for imaging the texture together to obtain a larger imaging range. The embodiments of the present disclosure do not specifically limit the providing mode of the photosensitive light source.

For example, in some embodiments, the texture recognition apparatus 100 is a display apparatus with the under-screen texture recognition function, and correspondingly includes a display panel. As shown in FIG. 5, the display panel includes a pixel array including a plurality of sub-pixels 111 arranged in an array. The light source array includes the pixel array, and the plurality of light sources 101 include a plurality of sub-pixels 111. Thus, the pixel array also serves as the light source array, and the plurality of sub-pixels 111 also serve as the plurality of light sources 101. Therefore, the compactness of the device can be improved, and the arrangement difficulty of each functional structure can be reduced.

For example, the sub-pixels 111 in the entire display region of the display panel may be controlled to further serve as the photosensitive light sources, and the image sensor array may be correspondingly arranged on a side of the pixel array, thereby realizing full-screen texture recognition.

For example, in other embodiments, the display apparatus with the under-screen texture recognition function includes a display panel and separately provided light emitting devices which serve as the photosensitive light sources for realizing texture recognition, and for example, these light emitting devices are between adjacent pixel units in the pixel array, or overlap with pixel units of the pixel array. The embodiments of the present disclosure do not limit the specific form of the light source array.

For example, in the case where the texture recognition apparatus 100 is a display apparatus with the under-screen texture recognition function, and the plurality of sub-pixels also serve as the plurality of light sources, the controller 130 is configured to light up a plurality of sub-pixels 111 arranged continuously at the first time to form the first photosensitive light source. In some embodiments, the controller 130 is further configured to light up a plurality of sub-pixels 111 arranged continuously at the first time or at the second time different from the first time to form the second photosensitive light source.

Figure 12:
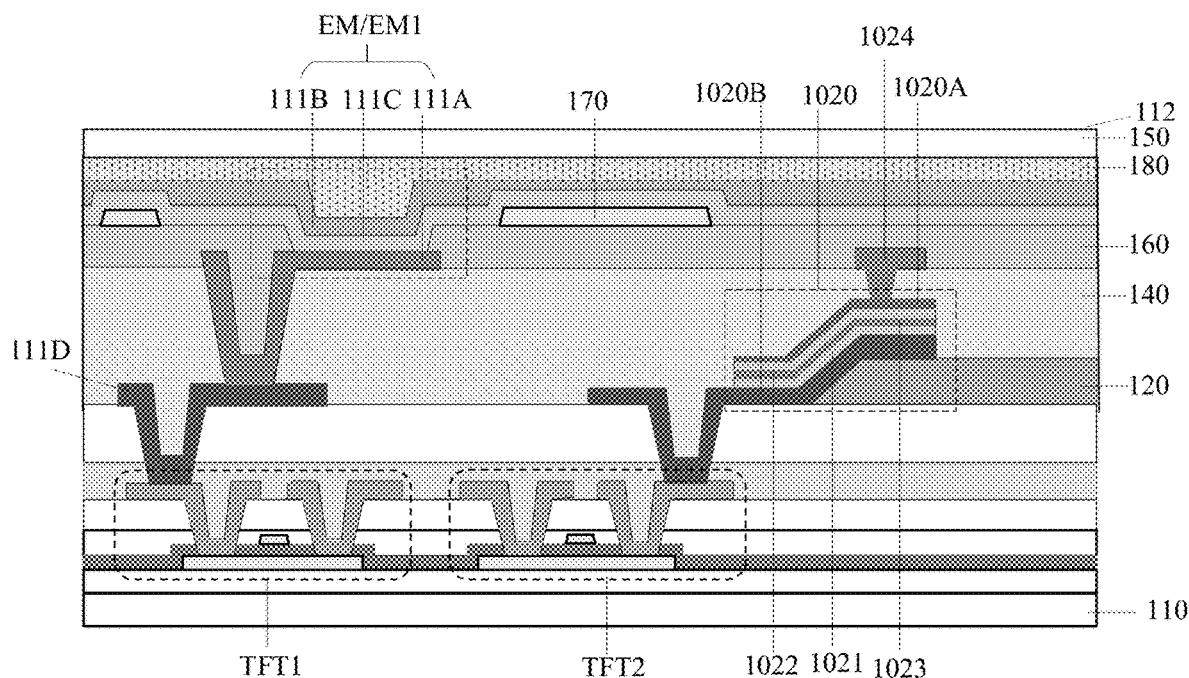
FIG. 12 is a schematic cross-sectional view of a display apparatus provided by at least one embodiment of the present disclosure.

For example, FIG. 12 shows a schematic cross-sectional view of a display apparatus. As shown in FIG. 12, the pixel array includes a drive circuit layer disposed on the base substrate 110 and a light emitting device layer disposed on a side of the drive circuit layer away from the base substrate 110. For example, each sub-pixel 111 in the pixel array includes a pixel drive circuit located in the drive circuit layer and a light emitting device EM located in the light emitting device layer. Each pixel drive circuit includes elements such as a thin film transistor TFT1 and a storage capacitor (not shown in the figure). The light emitting device EM includes a first electrode 111A (e.g., an anode), a second electrode 111B (e.g., a cathode), and a light emitting layer 111C between the first electrode 111A and the second electrode 111B. The first electrode 111A of the light emitting device EM is electrically connected to the thin film transistor TFT1 through a connection electrode 111D. Each of the plurality of image sensors 102 includes a photosensitive element 1020 and a switch element configured to control the photosensitive element 1020, such as a thin film transistor TFT2. The photosensitive element 1020 is disposed between the drive circuit layer and the light emitting device layer, and the switch element is disposed in the drive circuit layer, for example, the switch elements (thin film transistors TFT2) of the plurality of image sensors 102 are disposed in the same layer as the thin film transistors TFT1, thereby simplifying the manufacturing process of the display apparatus.

It should be noted that in the embodiments of the present disclosure, the term "in a/the same layer" refers to that the two functional layers or structural layers are in the same layer and formed by the same material in the layer-stacked structure of the display substrate, that is, in the manufacturing process of the display substrate, the two functional layers or structural layers may be formed by the same material layer, and required patterns and structures may be formed by the same patterning process. The term "the switch elements (thin film transistors TFT2) of the plurality of image sensors 102 are disposed in the same layer as the thin film transistors TFT1" refers that functional layers of the switch elements (thin film transistors TFT2) of the plurality of image sensors 102 are respectively arranged in the same layers in one-to-one correspondence with the same functional layers of the thin film transistor TFT1. For example, the thin film transistor TFT1 and the thin film transistor TFT2 both include an active layer, a gate electrode, a source electrode and a drain electrode, and the same structures respectively in the thin film transistor TFT1 and the thin film transistor TFT2 are arranged in the same layer.

For example, the photosensitive element 1020 includes a first portion 1021 inclined relative to the surface of the base substrate 110, and includes a second portion 1022 and a third portion 1023 respectively located on two opposite sides of the first portion 1021, both of the second portion 1022 and the third portion 1023 are parallel to the surface of the base substrate 110. The photosensitive element 1020 includes a top electrode 1020A, a bottom electrode 1020B, and a semiconductor layer between the top electrode 1020A and the bottom electrode 1020B. The semiconductor layer includes, for example, a P-type semiconductor layer and an N-type semiconductor layer that are stacked in sequence, or includes a P-type semiconductor layer, an intrinsic semiconductor layer and an N-type semiconductor layer that are stacked in sequence. For example, the first portion 1021 of the photosensitive element 1020 is electrically connected to the thin film transistor TFT2 through the bottom electrode 1020B, the third portion 1023 is electrically connected to a wire 1024 through the top electrode 1020A, and the third portion 1023 is connected to a drive circuit through the wire 1024.

For example, in some embodiments, the plurality of sub-pixels includes a first group of sub-pixels, and the first group of sub-pixels includes a plurality of first light emitting devices arranged in the light emitting device layer, and the controller is configured to light up the first group of sub-pixels at the first time to provide the first photosensitive light source; at least part of the light incident side surface of each image sensor in the first group of image sensors faces the plurality of first light emitting devices.

For example, the first group of sub-pixels are arranged in a dot shape, a line shape or a pattern to respectively form a dot-shaped first photosensitive light source, a line-shaped first photosensitive light source or a patterned first photosensitive light source.

For example, referring to FIG. 12, the light incident side surface of each image sensor 102 is an upper surface of the photosensitive element 1020, and at least part of the upper surface faces the first light emitting device EM1, so as to fully accept the light emitted from the first light emitting device EM1 and reflected by the texture, and improve the light utilization rate. Moreover, in the case where the photosensitive element 1020 is inclined, in the same space range, the light incident side surface of the photosensitive element 1020 is increased, so that more light signals can be received by the photosensitive element 1020.

For example, in some embodiments, the plurality of sub-pixels further include a second group of sub-pixels, the second group of sub-pixels includes a plurality of second light emitting devices disposed in the light emitting device layer, and the controller is configured to light up the second group of sub-pixels at the first time or the second time different from the first time to provide a second photosensitive light source; at least part of the light incident side surface of each image sensor in the second group of image sensors faces the plurality of second light emitting devices. For example, the second group of sub-pixels are arranged in a dot shape, a line shape or a pattern to form a dot-shaped first photosensitive light source, a line-shaped first photosensitive light source or a patterned first photosensitive light source.

For example, in some embodiments, the display panel may be an organic light emitting diode (OLED) display panel, a quantum dot light emitting diode (QLED) display panel, etc., which is not limited by the embodiments of the present disclosure. The OLED display panel may be a flexible OLED display panel, for example. The OLED display panel has self-luminous characteristics, and the light emission of the display pixel units of the OLED display panel can be controlled or modulated as needed, which can provide convenience for texture collection and help to improve the integration degree of the apparatus.

For example, in addition to the pixel array, the display panel further includes signal lines (including gate lines, data lines, detection lines, etc.) for providing electrical signals (including scanning signals, data signals, detection signals, etc.), a pixel definition layer 160 for defining the plurality of sub-pixels, a spacer 170, an encapsulation layer 180 and the like, and the encapsulation layer 180 includes, for example, a stack of inorganic layers and organic layers. For example, according to needs, the display panel may further include other structures or functional layers, for example, include a touch structure and a polarizer located on a light emitting side of the display panel, and these structures are bonded to the display panel by the optical transparent adhesive, for example. The embodiments of the present disclosure do not limit the specific structure of the display panel.

For example, in some embodiments, the image sensor 102 may be various suitable types of image sensors such as a photodiode (such as a PIN diode or a PN diode). According to needs, for example, the image sensor 102 may sense only light with a certain wavelength (such as red light or green light) or sense all visible light. For example, the image sensor 102 is coupled with a processor (such as an integrated circuit chip) through a lead line, so that the collected texture images can be transmitted to the processor in the form of data signals, and the processor can realize operations such as texture recognition. For example, the processor may be implemented by a general-purpose processor or a special-purpose processor, which is not limited by the embodiments of the present disclosure.

For example, the controller 130 may be various types of integrated circuit chips with a processing function, which may have various computing architectures, such as a complex instruction set computer (CISC) architecture, a reduced instruction set computer (RISC) architecture, or a structure that implements a combination of multiple instruction sets. In some embodiments, the controller 130 may be a microprocessor, such as an X86 processor or an ARM processor, or may be a digital processor (DSP) or the like.

For example, in some embodiments, the controller 130 may further include a memory configured to store a control program for lighting the plurality of light sources to form the photosensitive light source, a control program for lighting the plurality of photosensitive light sources in a time-sharing manner, and the like, and may further configured to store data received or generated during operation. For example, the memory may be any form of storage medium, such as a volatile memory or a nonvolatile memory, such as a semiconductor memory or a magnetic medium memory, which is not limited by the embodiments of the present disclosure.

At least one embodiment of the disclosure further provides a manufacturing method of a texture recognition apparatus, and the manufacturing method includes: provide a base substrate; forming a light source array on a side of the base substrate, in which the light source array includes a plurality of light sources; forming an image sensor array on a side of the base substrate, in which the image sensor array includes a plurality of image sensors configured to receive light emitted from the plurality of light sources and reflected to the plurality of image sensors by a texture for texture collection. At least part of a photosensitive element of at least one image sensor of the plurality of image sensors is formed to be inclined relative to a surface of the base substrate.

For example, in some embodiments, the manufacturing method of the texture recognition apparatus further includes: providing a controller, in which the controller is coupled with the light source array and configured to control the light source array to operate at first time to provide a first photosensitive light source, the plurality of image sensors include a first group of image sensors, and the first group of image sensors is configured to receive light emitted from the first photosensitive light source and reflected to the first group of image sensors by a texture to form a first imaging range, at least part of the photosensitive element of each image sensor in the first group of image sensors is formed to be inclined relative to the surface of the base substrate, so that the light reflected to the first group of image sensors by the texture tends to vertically enter a light incident side surface of the at least part of the photosensitive element of each image sensor in the first group of image sensors. For example, the first group of image sensors includes a first image sensor and a second image sensor, the first image sensor is closer to the first photosensitive light source than the second image sensor, and an inclination angle of the first image sensor relative to the surface of the base substrate is formed to be less than or equal to an inclination angle of the second image sensor relative to the surface of the base substrate, referring to FIG. 7 and FIG. 8.

For example, the controller may further perform more functions, which may be referred to the above embodiments and are not described in detail here.

For example, in some embodiments, the texture recognition apparatus is a display apparatus with the under-screen texture recognition function, and correspondingly, the texture recognition apparatus includes a display panel. In this case, the manufacturing method of the texture recognition apparatus further includes: forming a display panel, in which forming the display panel includes forming a pixel array, and the pixel array includes a plurality of sub-pixels arranged in an array; the light source array includes the pixel array, and the plurality of light sources include the plurality of sub-pixels.

For example, forming the pixel array includes: forming a drive circuit layer on the base substrate, and forming a light-emitting device layer on a side of the drive circuit layer away from the base substrate. Each of the plurality of image sensors includes a photosensitive element and a switch element configured to control the photosensitive element. The photosensitive element is formed between the drive circuit layer and the light-emitting device layer, and the switch element is formed in the drive circuit layer.

In the following, taking forming the display apparatus shown in FIG. 12 as an example, the manufacturing method of the texture recognition apparatus is introduced exemplarily.

First, a base substrate 110 is provided, for example, the base substrate 110 is a rigid substrate such as a quartz substrate or a glass substrate, or a flexible substrate such as a polyimide substrate, and the like. A functional layer 103 such as a buffer layer and a barrier layer is formed on the base substrate 110 to prevent impurities from entering the display apparatus from the base substrate 110. For example, a drive circuit layer is formed on the base substrate, and the drive circuit layer includes a thin film transistor TFT1 for the pixel array and a thin film transistor TFT2 of the image sensor, etc. For example, each functional layer of these structures is formed on the base substrate 110 one by one by patterning processes, and the specific process may be referred to related technologies and is not limited by the embodiments of the present disclosure.

For example, a passivation layer 104 and a planarization layer 105 are formed on the drive circuit layer to planarize the drive circuit layer. For example, a first insulation layer 120 is formed on the planarization layer 105. The first insulation layer 120 includes a plurality of first openings, and at least one sidewall 1201 of at least one of the first openings is inclined relative to the surface of the base substrate 110. For example, an inclination angle c of the at least one sidewall 1201 relative to the surface of the base substrate ranges from 40° to 70°, such as 45°, 50°, 55°, 60°, 65°, or the like. For example, the passivation layer 104 may be made of an inorganic material such as silicon oxide, silicon nitride, silicon oxynitride, or the like, and the planarization layer 105 and the first insulation layer 120 may be made of an organic material such as polyimide, resin, or the like.

Figure 14:
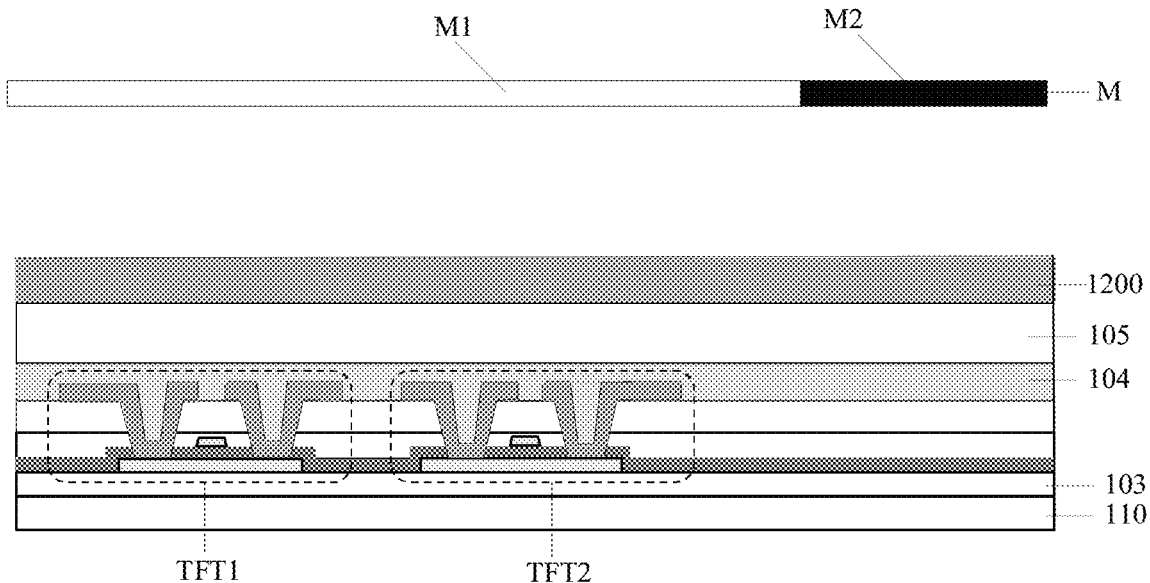

For example, in some embodiments, the first insulation layer 120 includes a photoresist material. As shown in FIG. 14, forming the first insulation layer includes: forming a photoresist material layer 1200 on a side of the base substrate 110, performing an exposure process on the photoresist material layer 1200 by using a mask M, in which the mask M includes a light-transmitting portion M1 and a light-shielding portion M2, the light-transmitting portion M1 corresponds to the plurality of first openings, and then performing a development process on the photoresist material layer 1200 to form the first insulation layer 120 with the plurality of first openings.

For example, during the exposure process, the inclination angles of the sidewalls of the first openings of the first insulation layer 120 can be adjusted by adjusting the exposure intensity and exposure time. Because the exposure degrees of the photoresist material at different depths are different, the exposure of the photoresist material at the top layer is more, and the exposure of the photoresist material at the bottom layer is less, so that the openings with the inclined side walls can be formed after the development process.

For example, in some examples, the first insulation layer 120 with the inclined sidewalls may be formed by performing multiple exposure processes. For example, during a first exposure by using the mask, the exposure intensity is strong, and the exposure time is controlled to expose the photoresist material layer 1200 in the top layer; during a second exposure process, the exposure intensity is medium, and the exposure time is controlled to expose the photoresist material layer 1200 in a deeper layer; during a third exposure process, the exposure intensity is low, and the exposure time is controlled to expose the photoresist material layer 1200 located in a further deeper layer, . . . , so that the exposure degrees of the photoresist material layer 1200 at different depths are different, and the first insulation layer 120 with the inclined sidewalls can be formed after the development process.

For example, in some examples, the first insulation layer 120 with the inclined sidewalls may be formed by separately performing exposure processes using a plurality of masks.

For example, a first exposure is performed by using a first mask, and the size of the light-transmitting portion M1 of the first mask is larger, so that the photoresist material layer 1200 on the top surface layer has a wider exposure range; then, a second exposure is performed by using a second mask, and the size of the light-transmitting portion M1 of the second mask is medium, so that the photoresist material layer 1200 in a deeper layer has a medium exposure range; then, a third exposure is performed by using a third mask, and the size of the light-transmitting portion M1 of the third mask is smaller, so that the photoresist material layer 1200 at a further deeper depth has a smaller exposure range, . . . , so that the exposure ranges of the photoresist material layer 1200 at different depths are different, and the first insulation layer 120 with the inclined sidewalls can be formed after the development process.

For example, in some embodiments, the mask M further includes a translucent transition portion between the light-transmitting portion M1 and the light-shielding portion M2. The translucent transition portion corresponds to the inclined side wall of the first insulation layer 120. Because the translucent transition portion can partially transmit light, the exposure degree at the inclined side wall can be controlled by the translucent transition portion, and then the first insulation layer 120 with the inclined side walls can be formed after the development. For example, in some examples, the translucent transition portion may have gradually changed light transmittance in a direction from the light-transmitting portion M1 to the light-shielding portion M2 to control the exposure degree. The embodiments of the present disclosure do not limit the specific way of forming the inclined side walls.

For example, photosensitive elements of the plurality of image sensors are formed respectively in the plurality of first openings, so that a portion of the photosensitive element of at least one of the plurality of image sensors on the at least one side wall is inclined relative to the surface of the base substrate 110.

Figure 13:
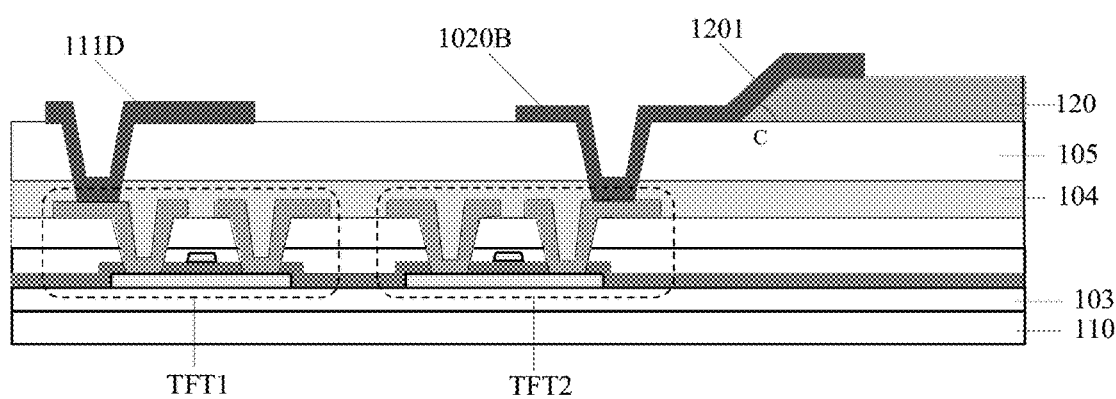
FIGS. 13-16 are schematic cross-sectional views of a display apparatus during a manufacturing process provided by at least one embodiment of the present disclosure.

For example, as shown in FIG. 13, vias are formed in the passivation layer 104 and the planarization layer 105 to expose the source electrodes or the drain electrodes of the thin film transistor TFT1 and the thin film transistor TFT2, and then a connection electrode 111D configured to electrically connect the first electrode of the light emitting device and the thin film transistor TFT1, and a bottom electrode 1020B of the photosensitive element 1020 are formed in the same layer, at least part of the bottom electrode 1020B is formed on the at least one sidewall 1201. For example, the connection electrode 111D and the bottom electrode 1020B are made of a metal material such as copper, aluminum, titanium, and the like, or an alloy material.

Figure 15:
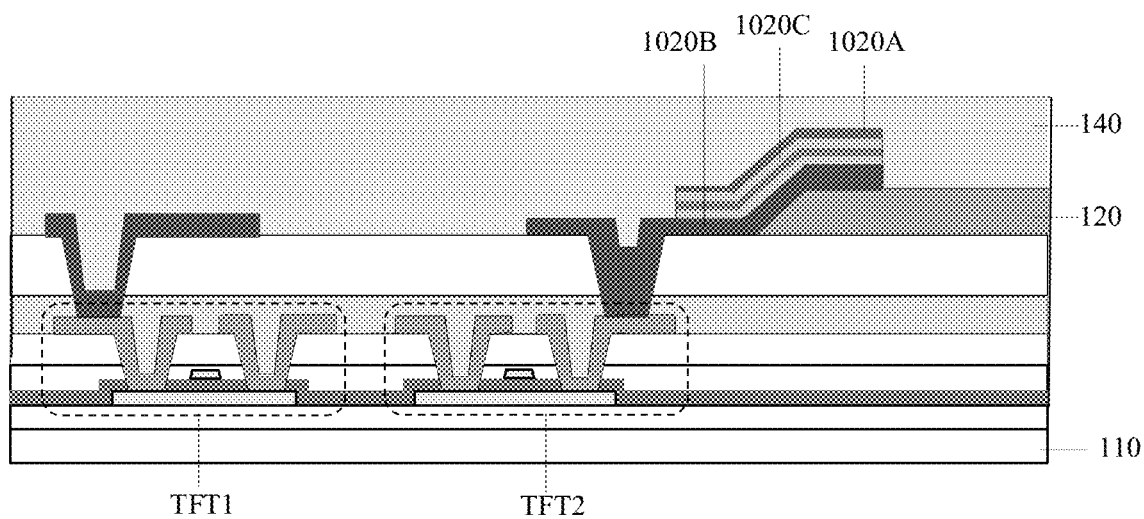
Figure 16:
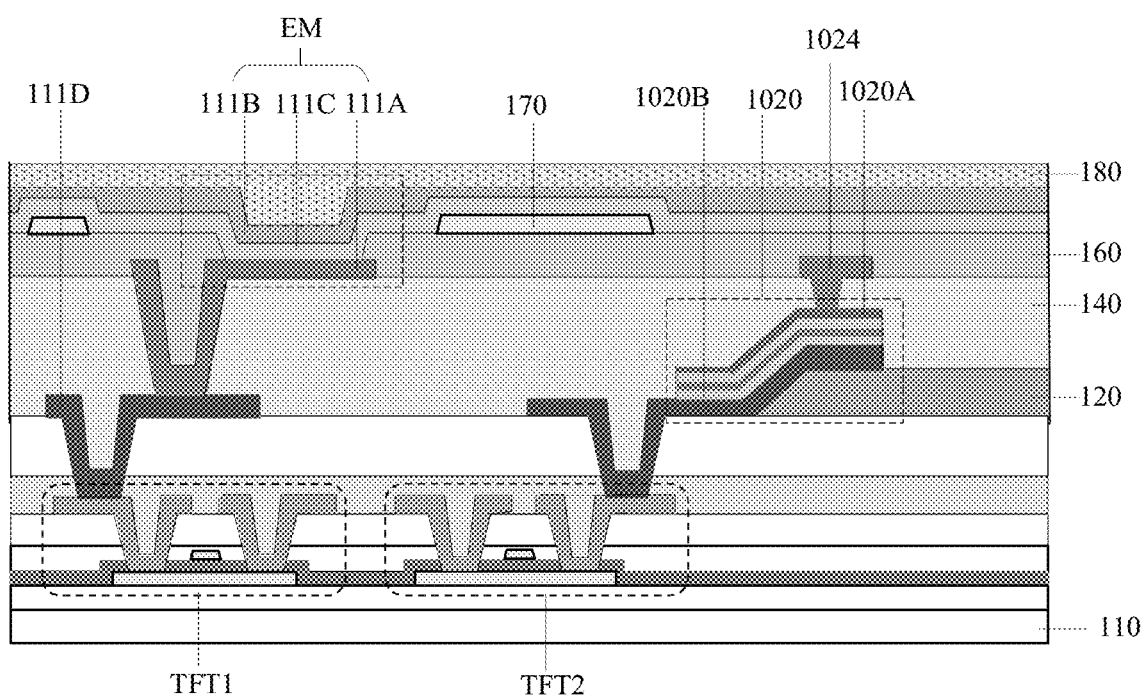

For example, as shown in FIG. 15, a semiconductor layer 1020C is formed on the bottom electrode 1020B. Forming the semiconductor layer 1020C includes sequentially forming a p-type semiconductor layer and an n-type semiconductor layer, or sequentially forming a p-type semiconductor layer, an intrinsic semiconductor layer and an n-type semiconductor layer. Then, a top electrode 1020A is formed on the semiconductor layer 1020C.

For example, the connection electrode 111D and the bottom electrode 1020B, the semiconductor layer 1020C and the top electrode 1020A are respectively formed by patterning processes. For example, one patterning process includes the steps of forming a material layer to be etched, forming a photoresist layer, exposing, developing and etching. The embodiments of the present disclosure are not limited in this aspect.

For example, as shown in FIG. 15, after the photosensitive element is formed, the planarization layer 140 is formed. For example, the planarization layer 140 may be formed by a coating process to planarize the photosensitive element.

For example, vias respectively exposing the connection electrode 111D and the top electrode 1020A are formed in the planarization layer 140, and then the first electrode 111A of the light emitting device EM and a wire 1024 electrically connected with the top electrode 1020A are formed. Thereafter, a pixel definition layer 160 including an opening exposing the first electrode 111A and a spacer 170 are formed. Thereafter, a light emitting layer 111C and a second electrode 111B are formed. The light emitting layer 111C includes, for example, a light emitting material layer and auxiliary light emitting layers such as a hole injection layer, a hole transport layer, an electron injection layer and an electron transport layer, and so on.

For example, the top electrode 1020A and the first electrode 111A may be made of a transparent conductive material, for example, a transparent metal oxide such as indium tin oxide (ITO), indium zinc oxide (IZO), gallium zinc oxide (GZO), or the like, and the second electrode 111B may be made of a metal material such as lithium (Li), aluminum (Al), magnesium (Mg), silver (Ag), or the like.

For example, after the light emitting device EM is formed, an encapsulation layer 180 is formed, and for example, the encapsulation layer 180 includes a stacked structure of a plurality of inorganic layers and organic layers, so as to encapsulate and protect the display panel. For example, in some embodiments, the encapsulation layer 180 includes a first inorganic layer, a first organic layer and a second inorganic layer which are sequentially stacked. The embodiments of the present disclosure are not limited in this aspect.

For example, in some embodiments, structures such as a touch layer and a cover plate 150 are further formed on the encapsulation layer 180. The formation methods of these structures can be referred to the related technology, and are not described in detail in the embodiments of the present disclosure.

The following several statements should be noted:

(1) The accompanying drawings involve only the structure(s) in connection with the embodiment(s) of the present disclosure, and other structure(s) can be referred to common design(s).

(2) For clarity, in accompanying drawings for illustrating the embodiment(s) of the present disclosure, the thickness of a layer or a region may be enlarged or reduced, that is, the drawings are not drawn in an actual scale. It should understood that, in the case that a component such as a layer, film, region, substrate or the like is referred to be "on" or "under" another component, it may be directly on or under the another component or a component is interposed therebetween.

(3) In case of no conflict, the features in different embodiments may be mutually combined to obtain new embodiments.

The above descriptions are only specific embodiments of the present disclosure, but the protection scope of the present disclosure is not limited thereto, the protection scope of the present disclosure should be determined by the protection scope of the claims.

What is claimed is:
1. A texture recognition apparatus, comprising:
a base substrate,
a light source array, on a side of the base substrate and comprising a plurality of light sources;

an image sensor array, on a side of the base substrate and comprising a plurality of image sensors, wherein the plurality of image sensors are configured to receive light emitted from the plurality of light sources and reflected to the plurality of image sensors by a texture for texture collection;

at least part of a photosensitive element of at least one image sensor of the plurality of image sensors is inclined relative to a surface of the base substrate;

a first insulation layer, wherein the first insulation layer is on a side of the base substrate and comprises a plurality of first openings, at least one side wall of at least one of the plurality of first openings is inclined relative to the surface of the base substrate; and photosensitive elements of the plurality of image sensors are respectively in the plurality of first openings, so that a portion of the photosensitive element of the at least one image sensor on the at least one side wall is inclined relative to the surface of the base substrate;

wherein the photosensitive element of the at least one image sensor comprises a first portion inclined relative to the surface of the base substrate, and a second portion and a third portion that are respectively on two opposite sides of the first portion, and both the second portion and the third portion are parallel to the surface of the base substrate; and the first portion of the photosensitive element of at least one image sensor of the plurality of image sensors has an inclination angle ranging from 40° to 70° relative to the surface of the base substrate.

2. The texture recognition apparatus according to claim 1, further comprising a controller, wherein the controller is configured to control the light source array to operate to provide a first photosensitive light source at first time, the plurality of image sensors comprise a first group of image sensors, and the first group of image sensors is configured to receive light emitted from the first photosensitive light source and reflected to the first group of image sensors by a texture to form a first imaging range, at least part of a photosensitive element of each image sensor in the first group of image sensors is inclined relative to the surface of the base substrate, so that the light reflected to the first group of image sensors by the texture tends to vertically enter a light incident side surface of the at least part of the photosensitive element of each image sensor in the first group of image sensors.

3. The texture recognition apparatus according to claim 2, wherein the first group of image sensors comprises a first image sensor and a second image sensor, the first image sensor is closer to the first photosensitive light source than the second image sensor, an inclination angle of a photosensitive element of the first image sensor relative to the surface of the base substrate is less than or equal to an inclination angle of a photosensitive element of the second image sensor relative to the surface of the base substrate.

4. The texture recognition apparatus according to claim 2, wherein the controller is further configured to control the light source array to operate to provide a second photosensitive light source at the first time or at second time different from the first time, the plurality of image sensors comprise a second group of image sensors, the second group of image sensors is configured to receive light emitted from the second photosensitive light source and reflected to the second group of image sensors by a texture to form a second imaging range, and the second imaging range is different from the first imaging range, at least part of a photosensitive element of each image sensor in the second group of image sensors is inclined relative to the surface of the base substrate, so that the light reflected to the second group of image sensors by the texture tends to vertically enter a light incident side surface of the at least part of the photosensitive element of each image sensor in the second group of image sensors.

5. The texture recognition apparatus according to claim 4, wherein the second group of image sensors comprises a third image sensor and a fourth image sensor, the third image sensor is closer to the second photosensitive light source than the fourth image sensor, an inclination angle of a photosensitive element of the third image sensor relative to the surface of the base substrate is less than or equal to an inclination angle of a photosensitive element of the fourth image sensor relative to the surface of the base substrate.

6. The texture recognition apparatus according to claim 4, wherein the first imaging range is in a first ring shape and the second imaging range is in a second ring shape;

the second ring at least partially covers a central part of the first ring shape, or the second ring shape is tangent to the first ring shape.

7. The texture recognition apparatus according to claim 2, further comprising a display panel, wherein the display panel comprises a pixel array, and the pixel array comprises a plurality of sub-pixels arranged in an array;

the light source array comprises the pixel array, and the plurality of light sources comprise the plurality of sub-pixels.

8. The texture recognition apparatus according to claim 7, wherein the pixel array comprises a drive circuit layer on the base substrate and a light emitting device layer on a side of the drive circuit layer away from the base substrate, each of the plurality of image sensors comprises a photosensitive element and a switch element configured to control the photosensitive element, wherein the photosensitive element is between the drive circuit layer and the light emitting device layer, and the switch element is in the drive circuit layer.

9. The texture recognition apparatus according to claim 8, wherein the plurality of sub-pixels comprise a first group of sub-pixels, and the first group of sub-pixels comprises a plurality of first light emitting devices in the light emitting device layer, the controller is configured to light up the first group of sub-pixels at the first time to provide the first photosensitive light source;

the light incident side surface of the at least part of each image sensor in the first group of image sensors faces the plurality of first light emitting devices.

10. The texture recognition apparatus according to claim 8, wherein a first group of sub-pixels are arranged in a dot shape, a line shape or a pattern to form a dot-shaped, line-shaped or a patterned first photosensitive light source.

11. The texture recognition apparatus according to claim 1, wherein in a direction perpendicular to the surface of the base substrate, the second portion is provided at a height level different from a height level of which the third portion is provided.

12. The texture recognition apparatus according to claim 1, wherein the inclination angle between the photosensitive element of the at least one image sensor and the surface of the base substrate is formed according to a distance between the at least one image sensor and a corresponding light source, so that the light reflected by the texture to the at least one image sensor tends to be vertically incident on each image sensor.

13. A manufacturing method of a texture recognition apparatus, comprising:
  providing a base substrate;
  forming a light source array on a side of the base substrate, wherein the light source array comprises a plurality of light sources;
  forming an image sensor array on a side of the base substrate, wherein the image sensor array comprises a plurality of image sensors, the plurality of image sensors are configured to receive light emitted from the plurality of light sources and reflected to the plurality of image sensors by a texture for texture collection,
  wherein at least part of a photosensitive element of at least one image sensor of the plurality of image sensors is formed to be inclined relative to a surface of the base substrate;
  forming a first insulation layer on a side of the base substrate, wherein the first insulation layer comprises a plurality of first openings, and at least one side wall of at least one of the plurality of first openings is inclined relative to the surface of the base substrate, and
  forming photosensitive elements of the plurality of image sensors respectively in the plurality of first openings, so that a portion of the photosensitive element of the at least one image sensor on the at least one side wall is inclined relative to the surface of the base substrate;
  wherein the photosensitive element of the at least one image sensor comprises a first portion inclined relative to the surface of the base substrate, and a second portion and a third portion that are respectively on two opposite sides of the first portion, and both the second portion and the third portion are parallel to the surface of the base substrate; and
  the first portion of the photosensitive element of at least one image sensor of the plurality of image sensors has an inclination angle ranging from 40° to 70° relative to the surface of the base substrate.

14. The manufacturing method according to claim 13, wherein the first insulation layer comprises a photoresist material, and forming the first insulation layer comprises:
  forming a photoresist material layer on a side of the base substrate,
  performing an exposure process on the photoresist material layer by using a mask, wherein the mask comprises a light-transmitting portion and a light-shielding portion, and the light-transmitting portion corresponds to the plurality of first openings, and
  performing a development process on the photoresist material layer.

15. The manufacturing method of claim 13, further comprising:
  forming a display panel, wherein forming the display panel comprises forming a pixel array comprising a plurality of sub-pixels arranged in an array;
  the light source array comprises the pixel array, and the plurality of light sources comprise the plurality of sub-pixels.

16. The manufacturing method of claim 15, wherein forming the pixel array comprises:
  forming a drive circuit layer on the base substrate, and
  forming a light emitting device layer on a side of the drive circuit layer away from the base substrate, wherein each of the plurality of image sensors comprises a photosensitive element and a switch element configured to control the photosensitive element, and the photosensitive element is formed between the drive circuit layer and the light emitting device layer, and the switch element is formed in the drive circuit layer.

17. The manufacturing method according to claim 13, further comprising:
  providing a controller, wherein the controller is coupled with the light source array and configured to control the light source array to operate at first time to provide a first photosensitive light source,
  the plurality of image sensors comprise a first group of image sensors, and the first group of image sensors is configured to receive light emitted from the first photosensitive light source and reflected to the first group of image sensors by a texture to form a first imaging range,
  at least part of a photosensitive element of each image sensor in the first group of image sensors is formed to be inclined relative to the surface of the base substrate, so that the light reflected to the first group of image sensors by the texture tends to vertically enter a light incident side surface of the at least part of the photosensitive element of each image sensor in the first group of image sensors; and
  the first group of image sensors comprises a first image sensor and a second image sensor, wherein the first image sensor is closer to the first photosensitive light source than the second image sensor, and an inclination angle of the first image sensor relative to the surface of the base substrate is formed to be less than or equal to an inclination angle of the second image sensor relative to the surface of the base substrate.

* * * * *